United States Patent
Kiper et al.

(10) Patent No.: US 7,786,915 B1
(45) Date of Patent: Aug. 31, 2010

(54) ADAPTIVE DIGITAL AUDIO PRE-DISTORTION IN AN AUDIO DIGITAL TO ANALOG CONVERTER

(75) Inventors: Halil Kiper, Dallas, TX (US); Srinath Mathur Ramaswamy, Richardson, TX (US); Gangadhar Burra, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/383,351

(22) Filed: Mar. 23, 2009

(51) Int. Cl.
 *H03M 1/66* (2006.01)
(52) U.S. Cl. ..................... 341/144; 375/296
(58) Field of Classification Search ......... 341/140–170; 375/229, 296, 297; 257/358; 330/149
See application file for complete search history.

(56) References Cited

U.S. PATENT DOCUMENTS

| | | | | |
|---|---|---|---|---|
| 6,344,815 B2 * | 2/2002 | Ureshino | ................ | 341/144 |
| 6,525,394 B1 * | 2/2003 | Kuhn et al. | ................ | 257/509 |
| 7,129,875 B1 * | 10/2006 | Altun et al. | ................ | 341/143 |
| 7,139,327 B2 * | 11/2006 | Vella-Coleiro et al. | ...... | 375/296 |
| 7,251,293 B2 * | 7/2007 | Vella-Coleiro | ............. | 375/297 |
| 7,288,999 B1 * | 10/2007 | Hietala et al. | ................ | 331/23 |
| 7,505,530 B2 * | 3/2009 | Rexberg et al. | ............. | 375/296 |

\* cited by examiner

*Primary Examiner*—Lam T Mai
(74) *Attorney, Agent, or Firm*—Ronald O. Neerings; Wade James Brady, III; Frederick J. Telecky, Jr.

(57) ABSTRACT

An adaptive digital pre-distortion block is used to cancel device nonlinearities to improve the overall linearity of a Delta-Sigma DAC system. In particular, the pre-distortion block may be implemented all in digital components and utilize programmable registers that change the pre-distortion transfer function either statically or dynamically, or both. Static changes can be for variation in process corners during production, whereas, dynamic changes can be used to correct nonlinear changes that can occur from environmental reasons such as voltage, temperature, aging and device stress.

20 Claims, 1 Drawing Sheet

ADAPTIVE DIGITAL AUDIO PRE-DISTORTION IN AN AUDIO DIGITAL TO ANALOG CONVERTER

BACKGROUND

1. Field

The present invention relates generally to audio signal processing and, more particularly, to digital to analog converters.

2. Description of Related Art

Design of digital audio systems involves a number of trade-offs that result in the system having certain characteristics that are beneficial and certain characteristics that are less desirable. For example, the range of the system can be sacrificed to allow for simpler circuit designs. Also, device size can be minimized by sacrificing other parameters depending on the desired characteristics of the system. One component of a digital audio system that affects its performance is the digital to analog converter (DAC). In particular, the DAC component may adversely affect the linearity of the digital audio system response because of nonlinearities within the DAC component.

A DAC typically includes a stage that converts a current to an analog voltage using an operational amplifier and a feedback resistor. If the feedback resistor includes nonlinear characteristics, then the voltage output from the DAC will also have a nonlinear response to the digital audio signal being input. There are a variety of semiconductor manufacturing techniques capable of producing the feedback resistor in different configurations. One such technique is a silicide block poly resistors which are highly linear over a wide range of inputs. However, manufacturing these types of resistors require additional processing steps that complicates their construction and increases cost. An alternative type of resistor is an n-well resistor that is relatively easier to manufacture but that has some nonlinear properties. For example, the resistance of the n-well resistor varies according to the voltage signal across it.

The nonlinearities of the digital audio system and its components may vary over time, temperature, or other variables. Additionally, nonlinearities may be introduced during the manufacturing process. There remains a need therefore, for an approach to address the linearity performance of a digital audio system that includes nonlinear resistors in the current-to-voltage converter of an audio DAC.

BRIEF SUMMARY

Embodiments of the present invention relate to an adaptive digital pre-distortion block that is used to cancel device nonlinearities to improve the overall linearity of a Delta-Sigma DAC system. In particular, the pre-distortion block may be implemented all in digital components and utilize programmable registers that change the pre-distortion transfer function either statically or dynamically, or both.

It is understood that other embodiments of the present invention will become readily apparent to those skilled in the art from the following detailed description, wherein it is shown and described only various embodiments of the invention by way of illustration. As will be realized, the invention is capable of other and different embodiments and its several details are capable of modification in various other respects, all without departing from the spirit and scope of the present invention. Accordingly, the drawings and detailed description are to be regarded as illustrative in nature and not as restrictive.

BRIEF DESCRIPTION OF DRAWINGS

Various aspects of embodiments of the invention are illustrated by way of example, and not by way of limitation, in the accompanying drawings, wherein.

DETAILED DESCRIPTION

The detailed description set forth below in connection with the appended drawings is intended as a description of various embodiments of the invention and is not intended to represent the only embodiments in which the invention may be practiced. The detailed description includes specific details for the purpose of providing a thorough understanding of the invention. However, it will be apparent to those skilled in the art that the invention may be practiced without these specific details. In some instances, well known structures and components are shown in block diagram form in order to avoid obscuring the concepts of the invention.

Embodiments of the present invention relate to an adaptive digital pre-distortion block that is used to cancel device nonlinearities to improve the overall linearity of a Delta-Sigma DAC system. In particular, the pre-distortion block may be implemented all in digital components and utilize programmable registers that change the pre-distortion transfer function either statically or dynamically, or both. Static changes can be for variation in process corners during production, whereas, dynamic changes can be used to correct nonlinear changes that can occur from environmental reasons such as voltage, temperature, aging and device stress. In the discussion included below, correcting a second-order nonlinearity is described in detail to more clearly illustrate the novel aspects of the present invention. However, higher-order nonlinearities may also be corrected for in a similar manner at the expense of more complex circuitry.

Figure 1:
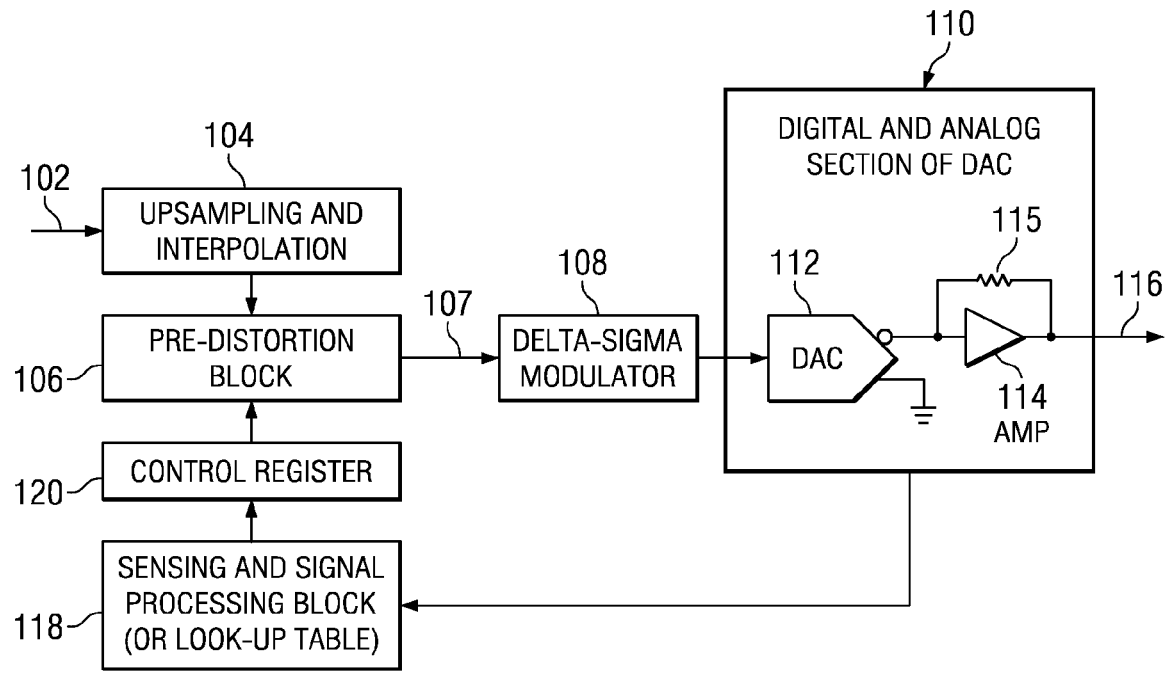
FIG. 1 depicts an audio signal processing system in accordance with the principles of the present invention.

The signal processing system of FIG. 1 receives a digital input signal 102 which can be processed by an upsampling and interpolation block 104. The resulting signal may, for example, be a 16-bit digital signal representing an audio input. However, one of ordinary skill will recognize that the resulting signal may be represented using a different number of bits without departing from the scope of the present invention. In a typical digital analog converter, this resulting signal would be supplied to a sigma-delta modulator and then converted. However, as shown in FIG. 1, a pre-distortion block 106 is used to shape the digital audio signal before it is supplied to the delta-sigma-modulator 108.

As explained in more detail later, the digital-to-analog converter has nonlinearities that are corrected for by the pre-distortion block 106. In operation, then, the digital audio signal is pre-distorted resulting in a digital signal 107 that is supplied to the sigma-delta modulator 108. The output of the modulator 108 is supplied as input to the digital-to-analog conversion section 110. Within the section 110, a digital-to-analog converter (DAC) 112 produces a output current which is converted into a corresponding voltage signal by the operational amplifier 114. This voltage signal is supplied as an output 116 to a load (not shown). The voltage signal from the amplifier is also coupled back to the amplifier's input through a feedback loop that includes a resistor 115. One exemplary value for the resistor 115 is about 10 kΩ.

In particular, the resistor 115 can be an n-well resistor. This type of resistor is relatively easy to manufacture during the semiconductor manufacturing process. It does not require complex masking or processing steps and does not require large amounts of space on a chip. However, n-well resistors have a resistance that tends to vary with the voltage signal applied across it. Thus, the n-well resistor contributes to non-linearities in the operation of the digital to analog section 110. Other factors such as age, temperature, and other stresses can also contribute to this nonlinear behavior. Another factor that contributes to the nonlinear behavior are the process corners of the manufacturing process when constructing the n-well resistor.

The behavior of the digital to analog section 110 can be tested or monitored to generate a characterization of its behavior. This characterization data can be supplied to a sensing and signal processing block 118. This block determines, based on the characterization information, how the digital to analog section 110 is operating and, in particular, determines the parameters of how non-linear its response is. This sensing block 118 can be such that a control signal supplied to the DAC 112 and the output signal 116 are compared to determine the non-linear characteristics of the digital to analog section 110. Also, a look up table could be used such that certain sensed parameters are used to determine a value from the table.

This value whether it is from a look up table or generated by a signal processing block is supplied to a control register 120. The value or values in the control register 120 are used by the pre-distortion block 106 to control how it pre-distorts the digital audio signal. Thus, the digital audio signal is pre-distorted in such a way that when it passes through the digital to analog section 110, the resulting output signal 116 is a linear function of the input digital audio signal. The control register 120 may have its values set at the time of manufacture and thereby address static nonlinearities such as those caused by the manufacturing process corners. Also, the control register 120 may be dynamically updated during the operation of the system to accommodate dynamic changes such as temperature, aging, and other stresses as they occur.

The shape of the pre-distortion signal is based on the non linear characterization of the digital and analog section 110. The behavior of the section 110 can be modeled as a second-order polynomial. However, if higher order nonlinearities are desired to be canceled, higher ordered polynomials may be used to model the behavior.

In other words, the section 110 may be modeled as $V_{OUT}=ax^2+bx+c$. The goal is to design a pre-distortion function, $f(x)$ that makes $V_{OUT}$ a linear function of the input signal. In operation, the input signal x is supplied to the pre-distortion block 106 where a function $f(x)=x'$ is applied. The signal x' is then converted by the digital and analog section 110 to produce $V_{OUT}$ 116. The goal is for x' to be such that $V_{OUT}=ax'^2+bx'+c=bx+c$.

Solving for x' leads to a Taylor series approximation that $x'=f(x)=x-(a/b)x^2$. This approximation is more accurate for smaller values of a but, if desired, the cube term for the approximation can be included as well.

Applying this pre-distortion function to the system of FIG. 1 is explained with the help of some predefined variables:

dig_audio—the original digital audio signal which, for 16 bits varies from $-2^{15}$ to $2^{15}-1$ dig_pred—the pre-distorted digital audio signal dig_coeff—a nonlinearity coefficient that is derived $2^{15}$ constant this results from dig_audio being centered around 0 in both the x and y axes, whereas, the theoretical equation derived above is based on DAC output currents with a non-zero common mode value.

Using these terms the pre-distortion function can be written as:

$$\text{dig\_pred}=\text{dig\_audio}-\text{dig\_coeff}\times(\text{dig\_audio}+2^{15})^2$$

Additional definitions include:

x maxswing—this is a based on the design of the DAC and is the maximum swing of the DAC output current. As an example, the value of 50 μA can be used.

dig_audio maxswing—the maximum swing of the dig_audio signal. For the 16 bits in this example, the value is $2^{(16-1)}$.

Using the equation:

$$[(x'-x)/x\text{ maxswing}]=[\text{dig\_pred}-\text{dig\_audio}]/\text{dig\_audio maxswing}$$

the nonlinearity coefficient can be derived as $$\text{dig\_coeff}=a/b\ [x\text{ maxswing}/\text{dig\_audio maxswing}]$$

wherein a and b are the coefficients from the characterization curve described earlier.

Figure 2:
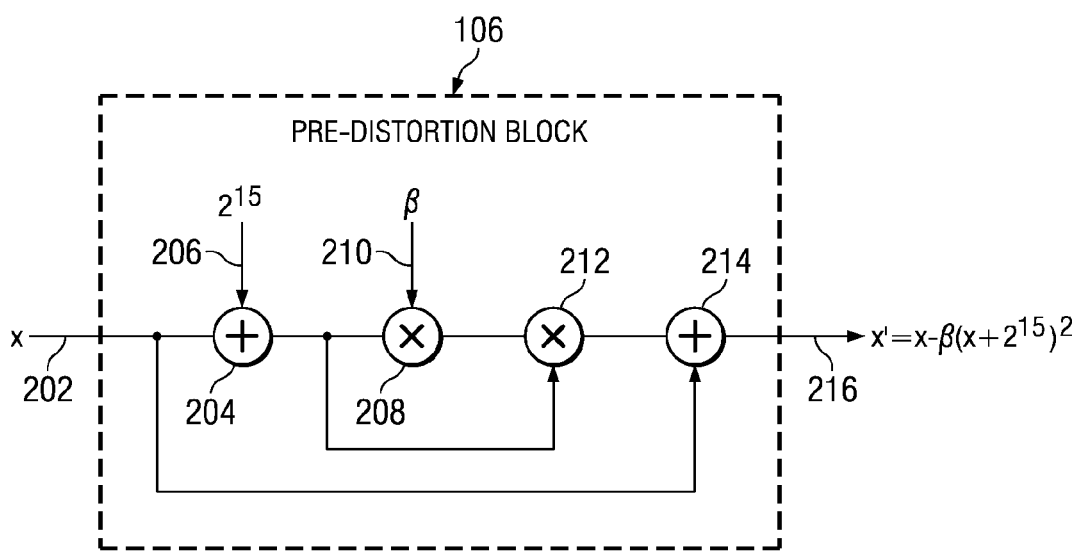
FIG. 2 depicts a pre-distortion block in accordance with the principles of the present invention.

One implementation of a pre-distortion block 106 is shown in FIG. 2. The pre-distortion coefficient 210 is labeled β. In this implementation an input signal x 202 is added 204 to a constant $2^{15}$ and the resulting sum is squared by multiplier 212 which is then multiplied 208 by the pre-distortion coefficient β 210. That result is then subtracted 214 to produce the output signal 216. The output signal 216 can be written as:

$$x'=x-\beta(x+2^{15})^2$$

By producing this signal at the output of pre-distortion block 106, it can be supplied to the digital and analog section 110 for conversion to an analog signal. The transfer function of the section 110 is $g(y)=ay^2+by+c$ and the result is that when supplied with x' as its input, the digital and analog section 110 will produce an output signal 116 of (bx+c) which is a linear response to the original digital audio input signal x that was supplied to the pre-distortion block 106.

The previous description is provided to enable any person skilled in the art to practice the various embodiments described herein. Various modifications to these embodiments will be readily apparent to those skilled in the art, and the generic principles defined herein may be applied to other embodiments. Thus, the claims are not intended to be limited to the embodiments shown herein, but are to be accorded the full scope consistent with each claim's language, wherein reference to an element in the singular is not intended to mean "one and only one" unless specifically so stated, but rather "one or more." All structural and functional equivalents to the elements of the various embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. Also, the term "exemplary" is meant to indicate that some information is being provided as an example only as is not intended to mean that that information is somehow special or preferred. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. An audio signal processing system, comprising:

a pre-distortion block configured to receive a digital input signal;

a digital to analog converter section, having an n-well resistor in a feedback loop, wherein the n-well resistor contributes to nonlinearities of the digital to analog converter section;

a control value configured to control the pre-distortion block to produce a digital pre-distorted signal as input to the digital to analog converter section; and an output configured to produce an output signal from the digital to analog converter section, wherein the output signal is a linear function of the digital input function.

2. The system of claim 1, wherein the control value corrects for the nonlinearities of the digital to analog converter section.

3. The system of claim 1, wherein the nonlinearities include a resistance of the n well resistor that varies according to voltage.

4. The system of claim 1, wherein the nonlinearities include circuit behavior which varies according to manufacturing process corners.

5. The system of claim 1, wherein the nonlinearities are second-order nonlinearities.

6. The system of claim 1, further comprising:

a control register configured to store the control value and provide the control value to the pre-distortion block.

7. The system of claim 6, wherein the control value is stored in the control register when manufacturing the system.

8. The system of claim 6, further comprising:

environment sensing components, having respective outputs related to operation of the digital to analog converter section.

9. The system of claim 8, wherein the control value is based on one or more of the respective outputs.

10. The system of claim 8, wherein the respective outputs relate to at least one of voltage, temperature, age, and stress.

11. An audio signal processing method, comprising:

receiving a digital input signal at a pre-distortion block;

controlling the pre-distortion block using a control value to produce a digital pre-distorted signal as input to a digital to analog converter section, having an n-well resistor in a feedback loop, wherein the n-well resistor contributes to nonlinearities of the digital to analog converter section;

converting the digital pre-distorted signal at the digital to analog converter section, outputting an output signal from the digital to analog converter section, wherein the output signal is a linear function of the digital input function.

12. The method of claim 11, wherein the control value corrects for the nonlinearities of the digital to analog converter section.

13. The method of claim 11, wherein the nonlinearities include a resistance of the n well resistor that varies according to voltage.

14. The method of claim 11, wherein the nonlinearities include circuit behavior which varies according to manufacturing process corners.

15. The method of claim 11, wherein the nonlinearities are second-order nonlinearities.

16. The method of claim 11, further comprising:

storing the control value in a control register configured to provide the control value to the pre-distortion block.

17. The method of claim 16, wherein the control value is stored in the control register when manufacturing the system.

18. The method of claim 16, further comprising:

sensing operational behavior of the digital to analog converter section with environment sensing components, having respective outputs related to operation of the digital to analog converter section.

19. The method of claim 18, wherein the control value is based on one or more of the respective outputs.

20. The method of claim 18, wherein the respective outputs relate to at least one of voltage, temperature, age, and stress.

* * * * *